(12) United States Patent
Jones et al.

(10) Patent No.: US 8,668,834 B2
(45) Date of Patent: *Mar. 11, 2014

(54) PROTECTING A MOLD HAVING A SUBSTANTIALLY PLANAR SURFACE PROVIDED WITH A PLURALITY OF MOLD CAVITIES

(75) Inventors: Bradley P. Jones, Pleasant Valley, NY (US); Sarah H. Knickerbocker, Hopewell Junction, NY (US); Richard P. Volant, New Fairfield, CT (US)

(73) Assignee: International Business Machines Corporations, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/453,371

(22) Filed: Apr. 23, 2012

(65) Prior Publication Data

US 2012/0207920 A1 Aug. 16, 2012

Related U.S. Application Data

(62) Division of application No. 12/573,904, filed on Oct. 6, 2009.

(51) Int. Cl.
*C25F 3/00* (2006.01)
*B28B 7/38* (2006.01)

(52) U.S. Cl.
USPC .............. 216/11; 216/17; 216/89; 427/133

(58) Field of Classification Search
USPC .................. 216/11, 17, 89; 427/133
See application file for complete search history.

(56) References Cited

U.S. PATENT DOCUMENTS

| | | | |
|---|---|---|---|
| 4,882,827 A | 11/1989 | Kusumi et al. | |
| 4,948,627 A | 8/1990 | Hata et al. | |
| 5,112,025 A | 5/1992 | Nakayama et al. | |
| 6,105,852 A * | 8/2000 | Cordes et al. | 228/254 |
| 6,340,630 B1 | 1/2002 | Berger et al. | |
| 6,607,173 B2 | 8/2003 | Westmoreland | |
| 7,157,364 B2 | 1/2007 | Akram | |
| 7,348,270 B1 | 3/2008 | Danovitch et al. | |
| 2001/0019853 A1 | 9/2001 | Kroner | |
| 2003/0232174 A1 * | 12/2003 | Chang et al. | 428/156 |
| 2004/0245659 A1 * | 12/2004 | Glenn et al. | 264/1.24 |
| 2005/0085063 A1 | 4/2005 | Akram | |
| 2007/0290367 A1 | 12/2007 | Hwang | |
| 2008/0175939 A1 | 7/2008 | Danovitch et al. | |
| 2008/0285136 A1 | 11/2008 | Jacobowitz et al. | |
| 2009/0001248 A1 | 1/2009 | Farinelli et al. | |
| 2009/0014128 A1 * | 1/2009 | Pricone | 156/390 |
| 2009/0072392 A1 | 3/2009 | Dang et al. | |
| 2009/0176321 A1 * | 7/2009 | Park | 438/16 |
| 2010/0078858 A1 * | 4/2010 | Nishikawa | 264/427 |

FOREIGN PATENT DOCUMENTS

JP    61272362 A    12/1986

* cited by examiner

*Primary Examiner* — Binh X Tran
(74) *Attorney, Agent, or Firm* — Cantor Colburn LLP; Ian MacKinnon

(57) ABSTRACT

A method of protecting a mold having at least one substantially planar surface provided with a plurality of mold cavities includes inserting a plurality of mandrels into respective ones of the plurality of mold cavities, depositing a layer of mold protection material onto the at least one substantially planar surface and the plurality of mandrels, and removing the plurality of mandrels from the mold substrate.

9 Claims, 4 Drawing Sheets

PROTECTING A MOLD HAVING A SUBSTANTIALLY PLANAR SURFACE PROVIDED WITH A PLURALITY OF MOLD CAVITIES

CROSS-REFERENCES TO RELATED APPLICATION

This application is a divisional of U.S. application Ser. No. 12/573,904 filed Oct. 6, 2009, the disclosure of which is incorporated by reference herein in its entirety.

BACKGROUND

The present invention relates to the art of molds, and more particularly, to a method of protecting a mold having a substantially planar surface provided with a plurality of mold cavities.

Electronic devices such as semiconductors, processors, logic chips and the like employ solder balls as an interconnection to other components. That is, the solder balls provide a communication path to and from the electronic device. In addition, the solder balls may serve as an attachment element for securing the electronic device to another component. The solder balls are formed in molds and then attached to the electronic device. Over time, and through multiple uses and associated handling, the molds become scratched either from blading of the metal into cavities formed in the mold or from normal handling. Small scratches often lead to false defects that cause confusion during inspection. Moreover, over time, small scratches develop into cracks that may lead to catastrophic mold failure. In addition, some large scratches or gouges can behave like a pathway that captures and transferring solder between mold cavities.

SUMMARY

According to an aspect of the exemplary embodiment, a method of protecting a mold having at least one substantially planar surface provided with a plurality of mold cavities includes inserting a plurality of mandrels into respective ones of the plurality of mold cavities, depositing a layer of mold protection material onto the at least one substantially planar surface and the plurality of mandrels, and removing the plurality of mandrels from the mold substrate.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Mold substrates, particularly those used in connection with the formation of solder balls, get scratched either from blading of metal into mold cavities or from normal handling. Small scratches may be a nuisance or lead to false defects that create confusion during inspection. Overtime, scratches develop into cracks, which may become catastrophic failures that lead to mold breakage. In addition, large scratches or gouges can behave like a cavity, capturing and transferring solder between adjacent mold cavities. Towards that end, it is desirable to form a mold having a surface that is resistant to scratches, cracking, damage and other defects.

Figure 1:
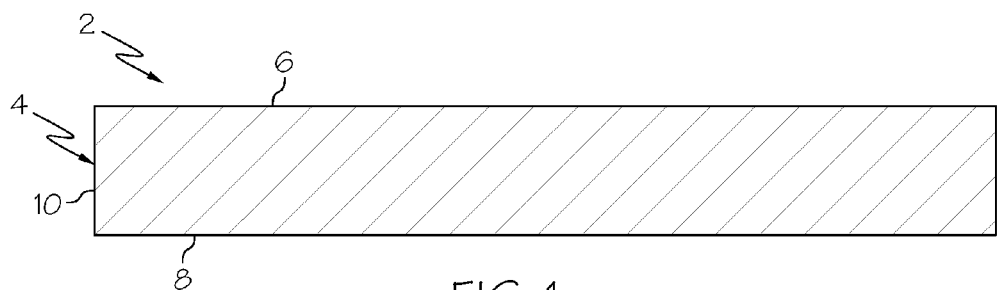
FIG. 1 is cross-sectional view of a substrate having first and second substantially planar surfaces for a mold in accordance with an exemplary embodiment.
Figure 2:
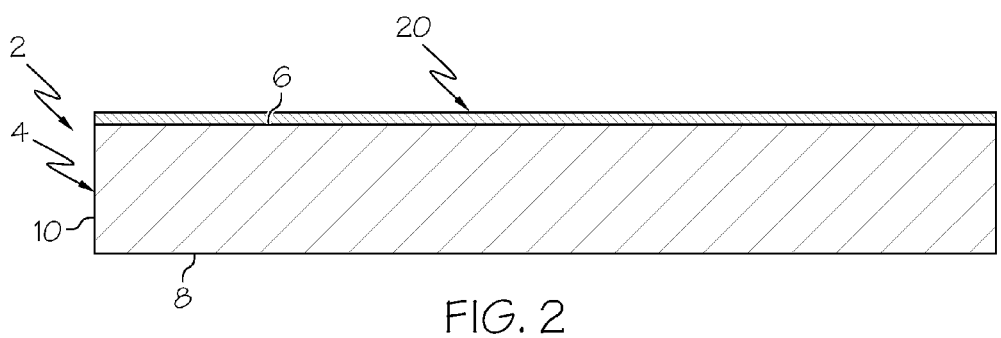
FIG. 2 is a cross-sectional view of the substrate of FIG. 1 showing a protective layer deposited on one the first substantially planar surface.
Figure 3:
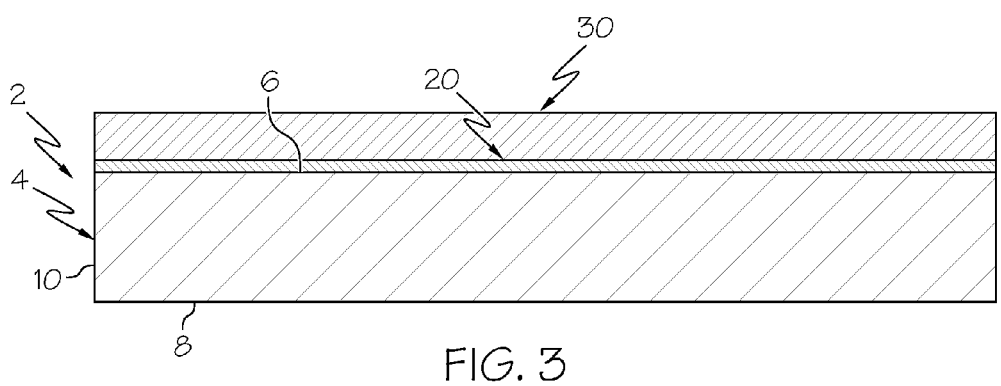
FIG. 3 is a cross-sectional view of the substrate of FIG. 2 showing a photo resist layer positioned on the protective layer.
Figure 4:
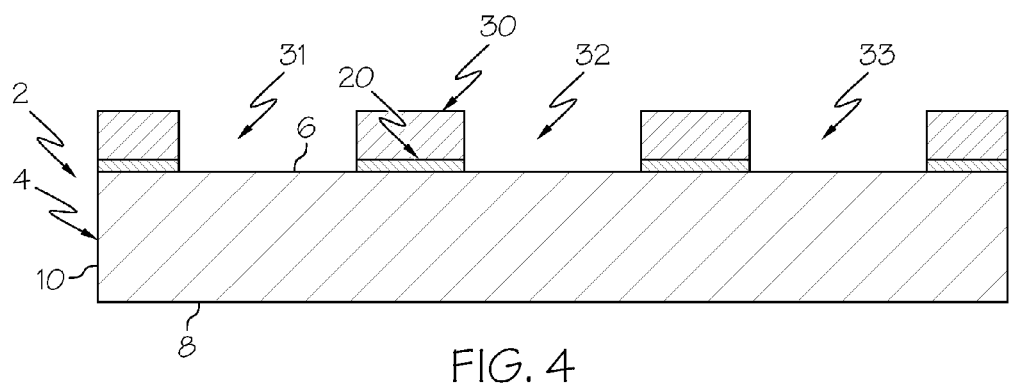
FIG. 4 is a cross-sectional view of the substrate of FIG. 3 illustrating a pattern etched through the photo resist layer and the protective layer.
Figure 5:
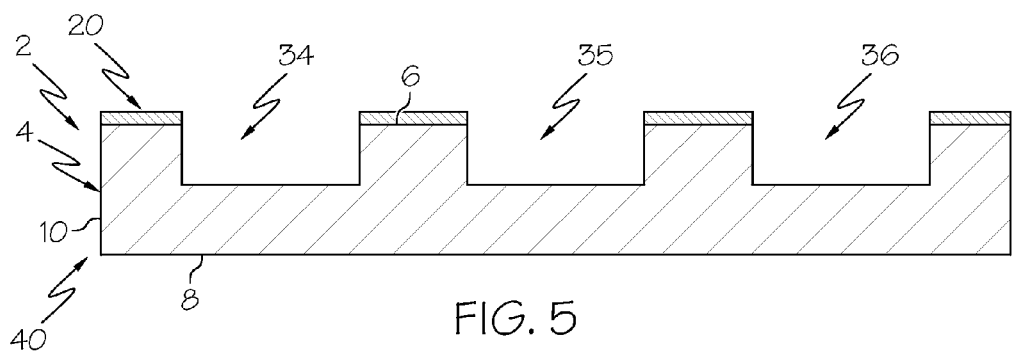
FIG. 5 is a cross-sectional view of a mold assembly FIG. 4 showing the photo resist layer removed and a plurality of cavities etched into the substrate to form a mold having a protective layer in accordance with an exemplary embodiment.

As best shown in FIGS. 1-5, a mold substrate constructed in accordance with an exemplary embodiment is indicated generally at 2. Mold substrate 2 is formed preferably from borosilicate glass (BSG) and includes a main body 4 having a first substantially planar surface 6 that extends to a second substantially planar surface 8 through an intermediate portion 10. In accordance with an exemplary embodiment, a protective layer 20 of mold protection material is deposited upon first substantially planar surface 6 as shown in FIG. 2. Mold protection material can take on a variety of forms such as, SiC, Diamond like carbon (DLC), $Si_3N_4$, TiCN, TiN, $Al_2O_3$ and polytetraflouroethylene (PTFE). Of course, other materials having scratch resistant properties can also be used. Protective layer 20 is deposited upon first substantially planar surface 6 using a method such as chemical vapor deposition (CVD). Of course, other methods such as physical vapor deposition (PVD) can also be used to deposit the protective layer onto substrate 2. After depositing the mold protection material onto substrate 2 forming mold protective layer 20, a photo resist layer 30 is applied. Photo resist layer 30 takes the form of a lithographic film. After being applied, photoresist layer 30 is lithographically patterned and developed, so as to define cavity locations 31-33 that are etched into protective layer 20. At this point, the photo resist layer is removed and a plurality of cavities 34-36 are etched into substrate 2 at the cavity locations to form a mold 40 such as indicated at FIG. 5. As shown, cavities 34-36 extend from first substantially planar surface 6 into intermediate portion 10 stopping short of the second substantially planar surface 8. Once formed, cavities 34-36 can be filled with, for example, solder to form solder balls in a manner known in the art. Protective layer 20 ensures that first substantially planar surface 6 remains free from damage that can create irregularities within the solder balls formed in mold 40. Of course it should be understood that mold 40 can be employed to form a variety of molded components and should not be considered as being limited to forming solder balls.

Figure 6:
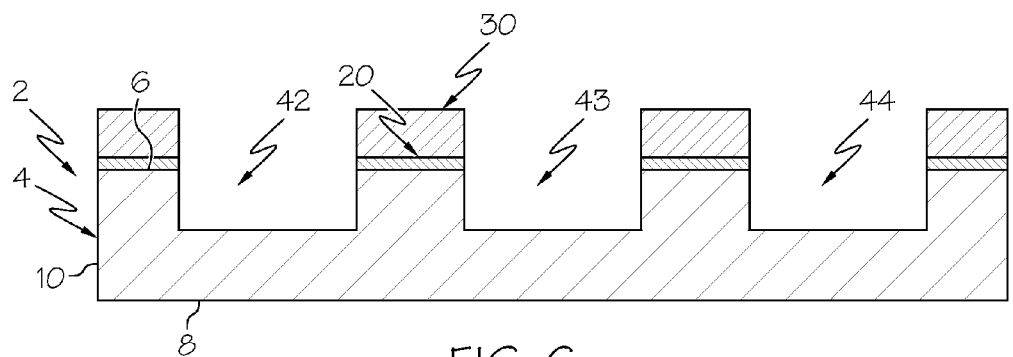
FIG. 6 is a cross-sectional view of the substrate of FIG. 3 illustrating the cavities etched through the photo resist layer and the protective layer.
Figure 7:
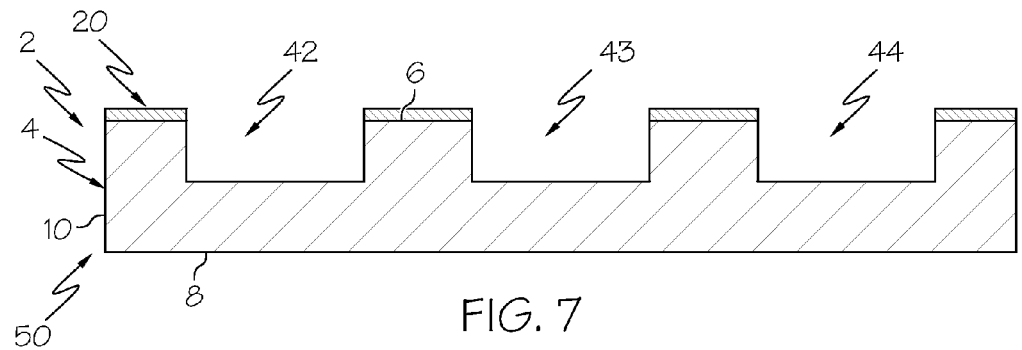
FIG. 7 is a cross-sectional view of the substrate of FIG. 6 showing the removal of the photo resist layer to form a mold having a protective layer in accordance with another aspect of the exemplary embodiment.

Reference will now be made to FIGS. 6-7 in describing an alternative aspect of the exemplary embodiment. As shown in FIG. 6, cavities 42-44 defined in photoresist layer 30 are etched into both protective layer 20 into substrate 2. Photo resist layer 30 is then removed, thus defining a mold 50 having protective layer 20 in FIG. 7. Once mold 50 is formed, cavities 42-44 are filled with solder to create solder balls in a manner similar to that described above. In a manner also similar to that described above, it should be understood that mold 50 can be employed to form a variety of molded components and should not be considered as being limited to forming solder balls.

Figure 8:
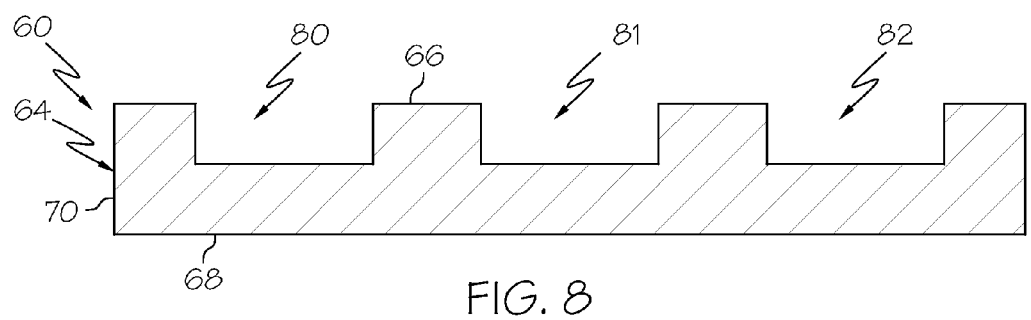
FIG. 8 is a cross-sectional view of a mold assembly having a plurality of cavities requiring a protective coating in accordance with another aspect of the exemplary embodiment.

Reference will now be made to FIG. 8 in describing a method of applying a protective layer to a pre-existing mold 60. In a manner similar to that described above, a mold 60 includes a substrate 64 formed from BSG. Substrate 64 includes a first substantially planar surface 66 that extends to a second substantially planar surface 68 through an intermediate portion 70. Mold 60 is shown to include a plurality of cavities 80-82 that are configured and disposed to create, in the exemplary embodiment shown, solder balls in a manner similar to that described above.

Figure 9:
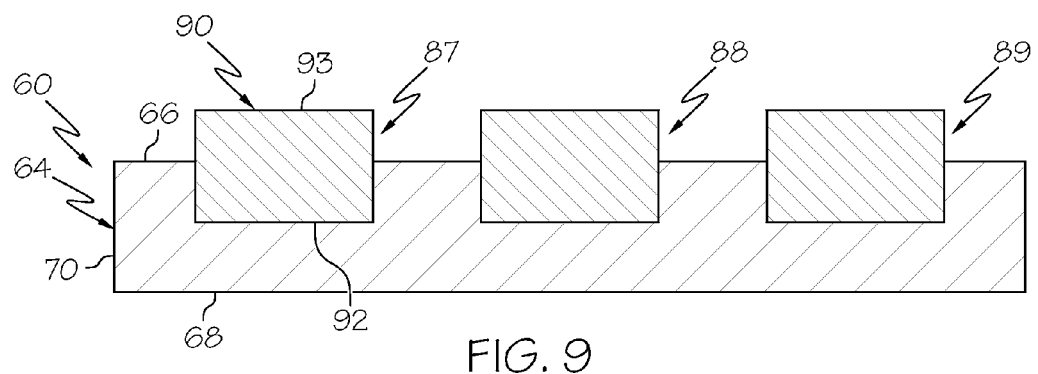
FIG. 9 is a cross-sectional view of the mold assembly of FIG. 8 showing mandrels inserted into the plurality of cavities.

Prior to applying a protective layer, each cavity 80-82 is filled with a corresponding sacrificial mandrel 87-89 deposited therein in FIG. 9. Sacrificial mandrels 87-89 are formed from a polymeric material such as, for example, a polymide. In this manner, mandrels 87-89 are capable of withstanding temperatures associated with depositing the protective layer onto mold 60 in a manner that will be described more fully below. As each mandrel is substantially similar, a detailed description will follow referencing mandrel 87, with an understanding that the remaining mandrels 88 and 89 are similarly formed.

Figure 10:
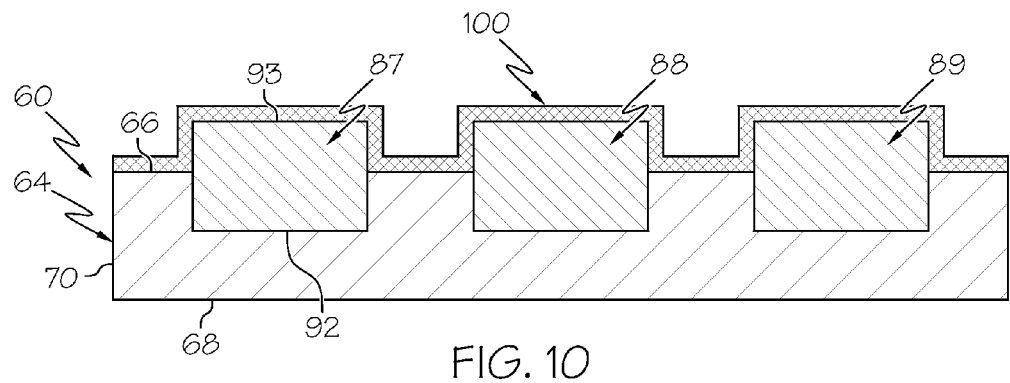
FIG. 10 is a cross-sectional view of the mold assembly of FIG. 9 illustrating a protective layer deposited over the mandrels.
Figure 11:
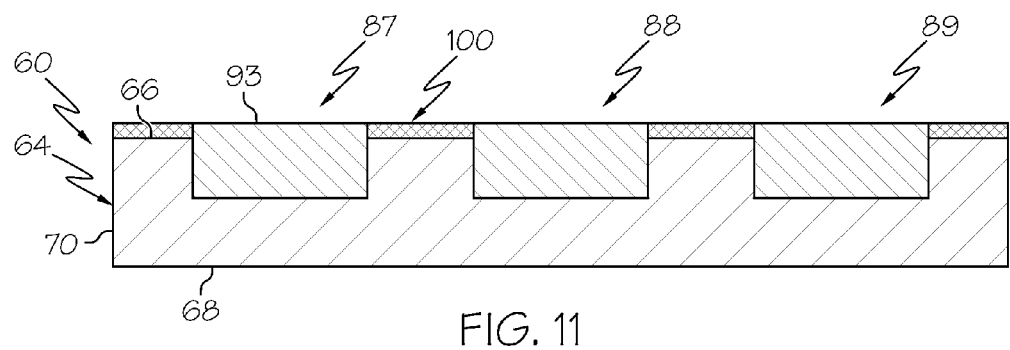
FIG. 11 is a cross-sectional view of the mold assembly of FIG. 10 showing the mandrels being polished even with the protective layer.
Figure 12:
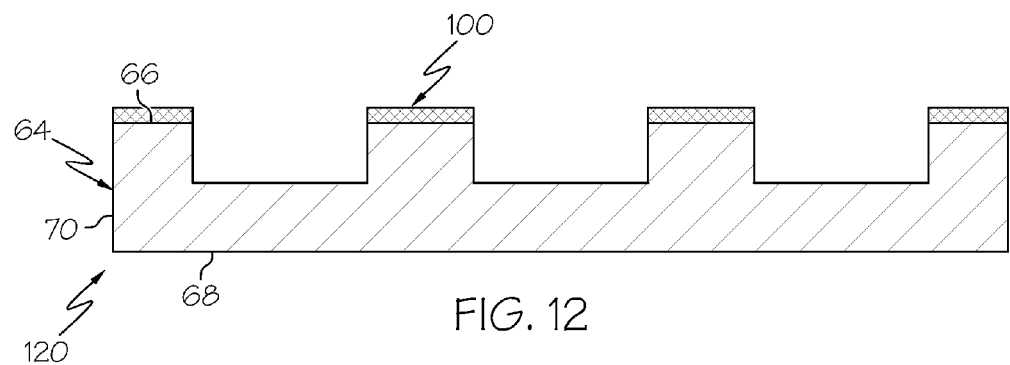
FIG. 12 is a cross-sectional view of the mold assembly of FIG. 11 showing the mandrels removed to reveal a mold assembly of FIG. 8 having a protective layer in accordance with another aspect of the exemplary embodiment.

As best shown in FIG. 9, mandrel 87 includes a main body member 90 having a lower portion 92 that extends into cavity 80 and an upper portion 93 that projects above first substantially planar surface 66. Once mandrels 87-89 are in place, protective layer 100 is deposited onto first substantially planar surface 6 over mandrels 87-89 such as shown in FIG. 10. That is, protective layer 100 not only covers substantially planar surface 66 but also covers exposed or upper portions 93 of mandrels 87-89. In a manner similar to that described above, protective layer 100 is applied using a spin on, cure, and photoresist patterning ashing process, but could also be applied using various other processes. After applying protective layer 100, upper portions 93 of mandrels 87-89, as well as portions of protective layer 100 thereon, are polished off, thereby creating the protective layer pattern shown in FIG. 11, and the remaining portions of mandrels 87-89 coplanar therewith. Then, as shown in FIG. 12, mandrels 87-89 are removed from cavities 80-82 leaving behind a refurbished mold 120 having a protective layer as seen in FIG. 12. Mandrels 87-89 are removed by a chemical etch, reactive ion etching (RIE), ashing and/or some other process.

In addition to applying a protective layer to pre-existing molds, the present exemplary embodiments can also be employed to refurbish molds have a pre-existing protective layer. That is, over time, a protective layer on a particular mold may become worn. In such a case, the protective layer is removed and a new protective layer is applied using the method described above. That is, after removing the old protective layer and prior to applying the new protective layer, mandrels, are deposited into each of the plurality of mold cavities in a manner similar to that described above. The protective layer is then applied over the mandrels. At this point, the mandrels are polished and removed so as to form a new protective layer on a pre-existing mold.

At this point, it should be understood that the exemplary embodiments of the present invention provide a method for enhancing operational life of mold, particularly those used in connection with forming solder balls. The protective coating ensures that the borosilicate glass substrate remain substantially free of defects and/or cracks that may affect quality of the particles, solder balls, formed within mold cavities. At this point, it should be understood that in addition to being employed in connection with molds for creating solder balls, the present exemplary embodiments can be employed in connection with other molding operations that employ mold substrates that are prone to damage with the damage having a negative impact on a final mold product.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to these diagrams or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of protecting a mold having at least one substantially planar surface provided with a plurality of mold cavities, the method comprising:
    inserting a plurality of mandrels into respective ones of the plurality of mold cavities;
    depositing a layer of mold protection material onto the at least one substantially planar surface and the plurality of mandrels; and
    removing the plurality of mandrels from the mold substrate.

2. The method of claim 1, wherein depositing a layer of mold protection material includes depositing at least one of SiC, Diamond like carbon (DLC), $Si_3N_4$, TiCN, TN, $Al_2O_3$ and polytetrafluoroethylene (PTFE).

3. The method of claim 1, further comprising: forming solder balls in each of the plurality of mold cavities.

4. The method of claim 1, wherein inserting a plurality of mandrels into respective ones of the plurality of mold cavities includes inserting mandrels formed from a polymeric material.

5. The method of claim 4, wherein inserting mandrels formed from a polymeric material includes inserting mandrels formed from polyimide.

6. The method of claim 1, wherein inserting a plurality of mandrels into respective ones of the plurality of mold cavities includes inserting a plurality of mandrels having a first end portion that extends into respective ones of the plurality of mold cavities and a second end portion that extends above the substantially planar surface.

7. The method of claim 6, wherein depositing a layer of mold protection material onto the at least one substantially planar surface and the plurality of mandrels includes depositing the layer of mold protection material onto the second end portion of each of the plurality of mandrels.

8. The method of claim 7, further comprising: removing the layer of mold protection material from the second end portion of each of the plurality of mandrels.

9. The method of claim 8, wherein removing the layer of mold protection material from the second end portion of each of the plurality of mandrels includes polishing each of the plurality of mandrels such that the second end portion is substantially co-planar with the layer of mold protection material.

* * * * *